United States Patent [19]

Winter et al.

[11] 3,997,834
[45] Dec. 14, 1976

[54] STATE-OF-CHARGE INDICATOR FOR ZINC-MERCURIC OXIDE PRIMARY CELLS

[75] Inventors: John J. Winter, Atlantic Highlands; James T. Breslin, Asbury Park; Raymond L. Ross, Ocean; Frederick Rothwarf, Toms River, all of N.J.

[73] Assignee: The United States of America as represented by the Secretary of the Army, Washington, D.C.

[22] Filed: Oct. 20, 1975

[21] Appl. No.: 623,873

[52] U.S. Cl. .............................. 324/29.5; 320/48
[51] Int. Cl.² ...................................... G01N 27/42
[58] Field of Search ................ 324/29.5; 320/48

[56] References Cited
UNITED STATES PATENTS

| 3,515,983 | 6/1970 | Lante | 324/29.5 |
| 3,808,522 | 4/1974 | Sharaf | 324/29.5 |

OTHER PUBLICATIONS

Peter Rohner et al., "Battery Impedance," Electrical Engineering, Sept. 1959, pp. 922–925.

*Primary Examiner*—R. V. Rolinec
*Assistant Examiner*—Michael J. Tokar
*Attorney, Agent, or Firm*—Nathan Edelberg; Robert P. Gibson; Frank J. Dynda

[57] ABSTRACT

A method for determining the state-of-charge for zinc mercuric oxide type primary cells. I-V curves of the cells are plotted and the nearly constant slopes of these I-V curves above 75mA are measured graphically. These slopes are used to define effective differential DC resistance values $(\Delta V/\Delta I)_{75mA}$ which have a linear relationship to charge expended, Q(A-h), which is graphically produced by plotting $(\Delta V/\Delta I)_{75mA}$ versus Q(A-h). This relationship is used as a basis for a state-of-charge indicator to determine the remaining charge to about 12%. One can also subtract the internal resistance of the cell (measured with an a-c bridge technique) from $(\Delta V/\Delta I)_{75mA}$ and obtain a new parameter, $R_p$, which is related to the polarization resistance of the cell. The maximum uncertainty can be reduced to less than 10% if the linear curve is produced by plotting polarization resistance $R_p$ of the cell versus the charge expended Q(A-h). More significantly, the polarization based state-of-charge graph is linear out to 100% of discharge and is applicable to cells discharged at abnormally high current.

7 Claims, 5 Drawing Figures

| CURVE | Q (A-h) |
|---|---|
| 1 | 0 |
| 2 | .46 |
| 3 | 1.1 |
| 4 | 1.8 |
| 5 | 3.4 |

TABLE II 3,997,834

STATE-OF-CHARGE INDICATOR FOR ZINC-MERCURIC OXIDE PRIMARY CELLS

The invention described herein may be manufactured, used and licensed by or for the Government for governmental purposes without the payment of any royalties thereon.

BACKGROUND OF THE INVENTION

This invention relates to state-of-charge tests for primary cells and more particularly to a method for measuring the state-of-charge of zinc-mercuric oxide primary cells.

There has been a long standing need for a reliable, nondestructive state-of-charge test for many of the most commonly used primary cells. Heretofore such tests were based on the relationship of the remaining charge to some output characteristic of the cell. However, the resulting relationship was found to be either too insensitive, too internally inconsistent, or too variable from cell to cell. While certain indicators were developed to improve the probability of selecting batteries having a state of charge exceeding 80% of capacity, the calibration curves obtained were extremely sensitive to discharge rates and temperatures as well as storage times and temperatures.

SUMMARY OF THE INVENTION

In accordance with the present invention there is provided a method for determining the state-of-charge level of zinc-mercuric oxide type primary cells. New, that is, unused, cells are discharged at selected rates to produce a plurality of prescribed or known state-of-charge values for each of the unused cells. Discrete effective differential DC resistance values of each of the discharged cells are plotted versus the corresponding prescribed sate-of-charge values to graphically produce a mean line or curve. The effective differential DC resistance of a used cell whose state-of-charge is to be measured is determined and this DC resistance value is applied to the mean linear curve to locate the corresponding state-of-charge value which is the state-of-charge of the used cell.

In another embodiment of the invention, cell polarization resistance values are substituted for the effective differential DC resistance values and the mean linear curve is then plotted as indicated above. Once the polarization resistance of a used cell is determined, the corresponding state-of-charge value is located in the mean linear curve to provide the state-of-charge of the used cell.

DESCRIPTION OF THE PREFERRED EMBODIMENT

Figure 1:
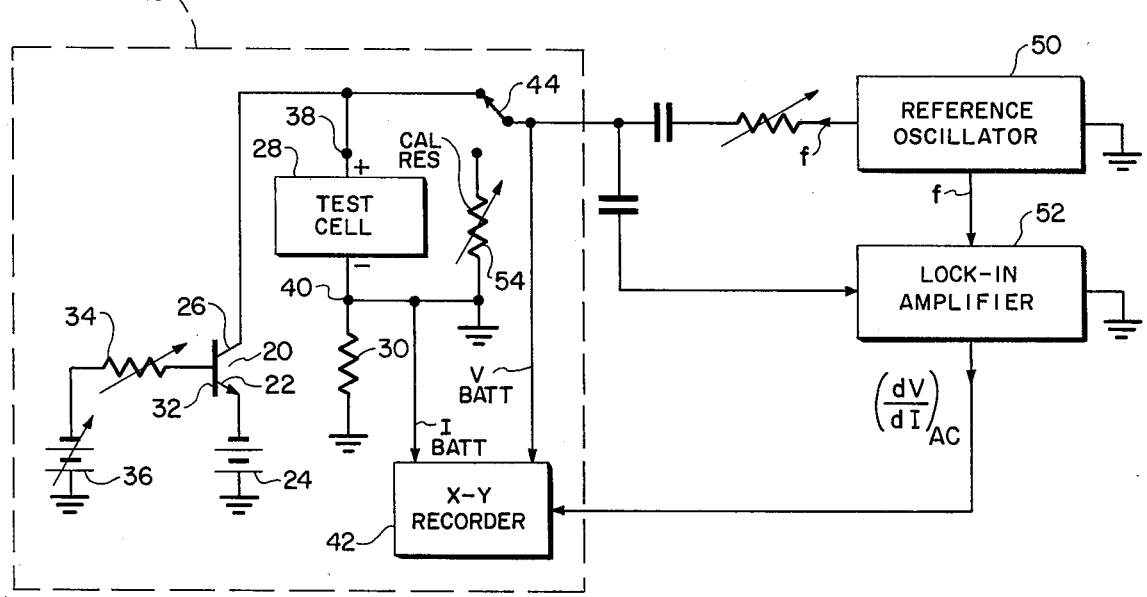
FIG. 1 is a schematic diagram illustrating the circuitry for obtaining various cell parameters.

The method for measuring the state-of-charge of zinc mercuric oxide primary cells is based upon the utilization of the parameters of current versus voltage curves, hereinafter referred to as I-V curves. Such curves are obtained for standard zinc mercuric oxide type primary cells by employing the circuit shown in FIG. 1. Referring now to FIG. 1, and specifically to that part of the circuit enclosed by the dashed line 10, there is shown a constant current circuit which includes a transistor 20 having its emitter 22 biased by a negative 3-volt power source 24 and its collector 26 connected to the test cell 28 in the polarity shown. Cell 28 in turn is connected to ground through a one-ohm resistor 30. The base 32 of transistor 20 is connected to ground through a series circuit of a relatively high variable resistor 34 and a variable negative voltage source 36 which may be varied from 0 to −3 volts. All cells to be tested are placed across terminals 38 and 40 as shown. The I-V plot for each cell is produced by means of a conventional X-Y recorder 42 to which is applied the respective cell voltage and cell current. As shown, the cell voltage $V_{BATT}$ in volts is applied as one input to the X-Y recorder through switch 44 and the cell current $I_{BATT}$ in milliamperes, mA, is applied as a second input to the X-Y recorder from terminal 40. With the system shown within the dashed line of FIG. 1, there is provided a forced discharge, that is, a discharge through a power supply in the constant current mode. When operated at constant current, the power supply behaves as an active variable load to maintain a particular current which is set by manual adjustment of the bias applied to transistor 20 through variable source 36.

Figure 2:
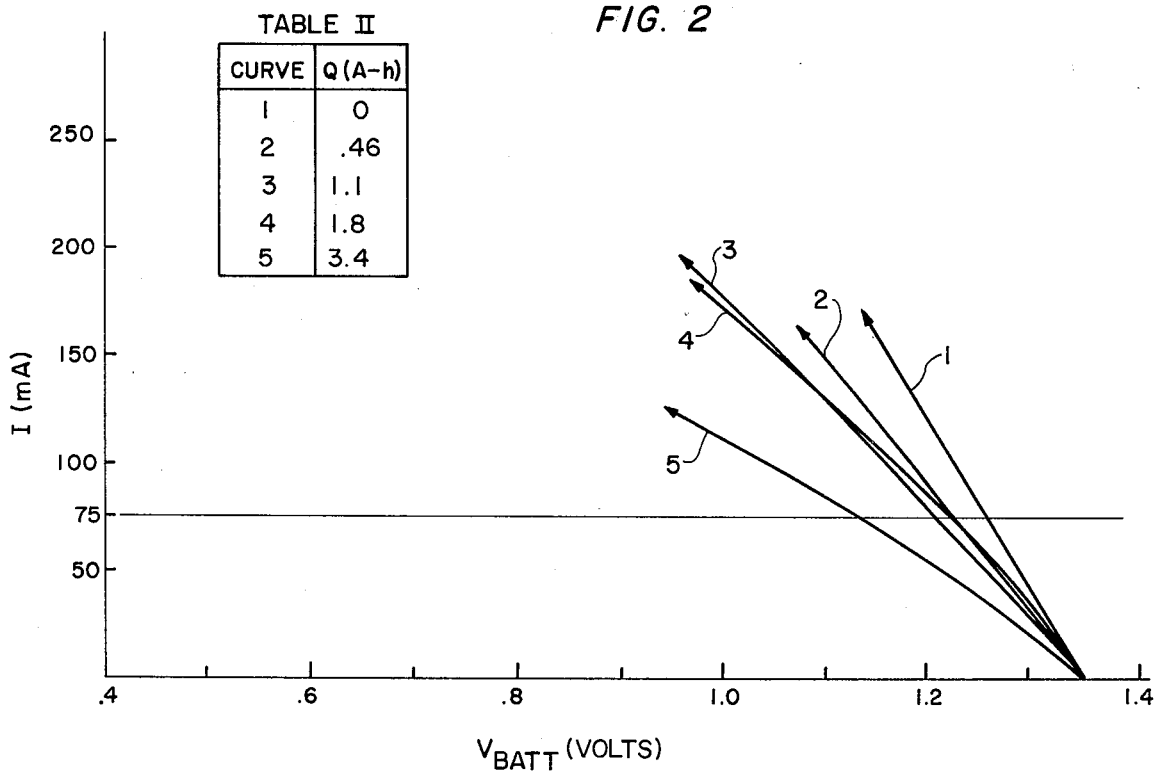
FIG. 2 represents typical I-V curves for a zinc mercuric oxide type primary cell.
Figure 3:
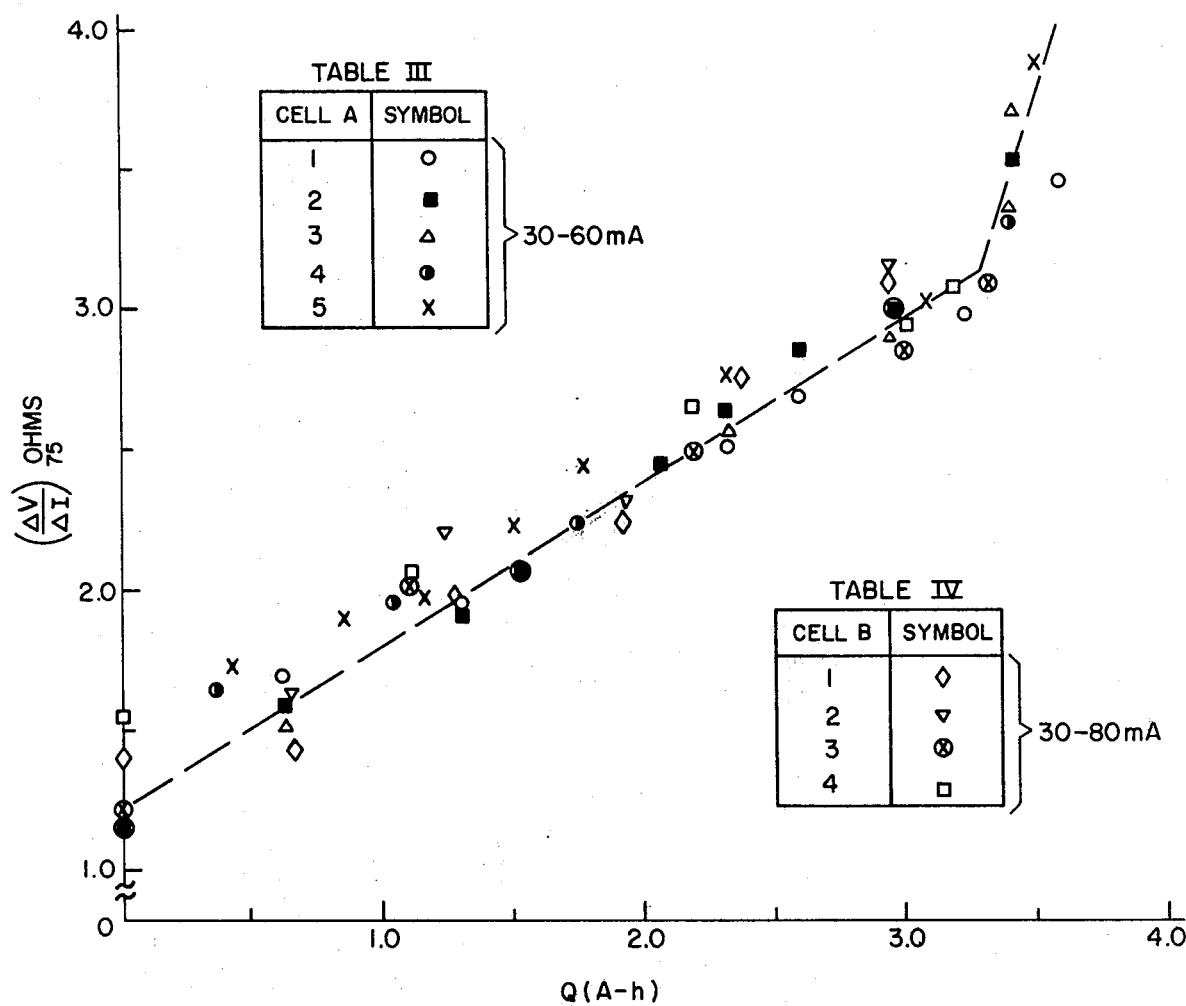
FIG. 3 represents the mean linear curve produced by plotting effective differential DC resistance at 75mA versus total prior discharge Q(A-h)

The first step is to provide a set of I-V curves utilizing the circuit of FIG. 1 as described above by starting with a new cell and removing known amounts of charge Q in ampere hours shown as Q(A-h). A typical set of I-V curves, labeled 1-5, for one of such cells is shown in FIG. 2. The respective state-of-charge of the cell corresponding to the numbered curves is shown in Table II. The I-V curves were traced by means of recorder 42 by increasing the current from 0 to 150mA in 30 to 40 seconds for each state-of-charge condition. Referring again to FIG. 2, it was found that the slope of each I-V curve varied with current up to about 75mA, above which the slope becomes nearly constant. Moreover, FIG. 2 illustrates that the slope above 75mA of the I-V curves decreases monotonically with the total charge expended. Once the I-V curves are produced, a second curve is plotted which shows the relationship between the slopes $(\Delta V/\Delta I)_{75mA}$ versus total discharge or expended quantity, Q(A-h), for respective cells. $(\Delta V/\Delta I)_{75mA}$ is the effective differential DC resistance, with the $\Delta V$ interval being 0.1 volts and the low current boundary of the interval is taken at 75mA due to the constant slope in that interval. FIG. 3 shows a typical relationship between the differential effective DC resistance $(\Delta V/\Delta I)_{75mA}$ and the total discharge Q(A-h) for two different types of zinc-mercuric oxide primary cells A and B whose symbolic data points are shown in Tables III and IV respectively. The state-of-charge was obtained by starting with new or unused cells and discharging them through fixed loads at currents ranging from 30 to 80mA since 80mA is the upper rating of these cells for practical use. Typical discharges were of the order of 0.4 A-h. A well known graphical recording was kept of current versus time so that the charge expended could easily be determined. It can be seen from FIG. 3 that the various data points define a line or mean linear curve of constant slope which represent the locus of the plotted data points up to the rated capacity of the cells which is 3.4 A–h. It was found that linearity with charge extended out to 90% of capacity with an experimental scatter of less than 7%. The linear curve shown in FIG. 3 is a single state-of-charge line believed to be valid for all similar type cells. To properly measure the state-of-charge of any cell, an I–V curve for that specific cell is first plotted as described in connection with FIG. 1. The slope $(\Delta V/\Delta I)_{75mA}$ is then measured, and the state-of-charge corresponding to this slope is then determined from FIG. 3. For example, if $(\Delta V/\Delta I)_{75mA}$ was measured as 2.5 ohms, then the discharge would be approximately 2.3 A–h, which, subtracted from the 3.4 A–h rated capacity, would indicate a state-of-charge of 1.1 ampere-hours (A–h).

It has been found that for zinc-mercuric oxide primary cells which have been drained at normal currents and have not been otherwise abused, the linear relationship shown in FIG. 3 is more than adequate. However, this method can be further refined by considering an internal high frequency AC resistance which, when subtracted from the effective differential DC resistance, $(\Delta V/\Delta I)_{75mA}$, yields an effective polarization resistance of the cell. The plot of effective polarization resistance versus Q(A–h) is found to provide a more accurate indication of charge expended. The polarization resistance is a better indicator of state-of-charge as it depends directly on the decrease of electrode surface area and concentration of reacting molecules as is well known in the art. The sign of the polarization is such so as to reduce the terminal voltage of a cell during discharge, and therefore has the same effect as an ohmic resistance. For cells discharged at excessively high currents, polarization resistance is the only acceptable state-of-charge indicator.

Figure 4:
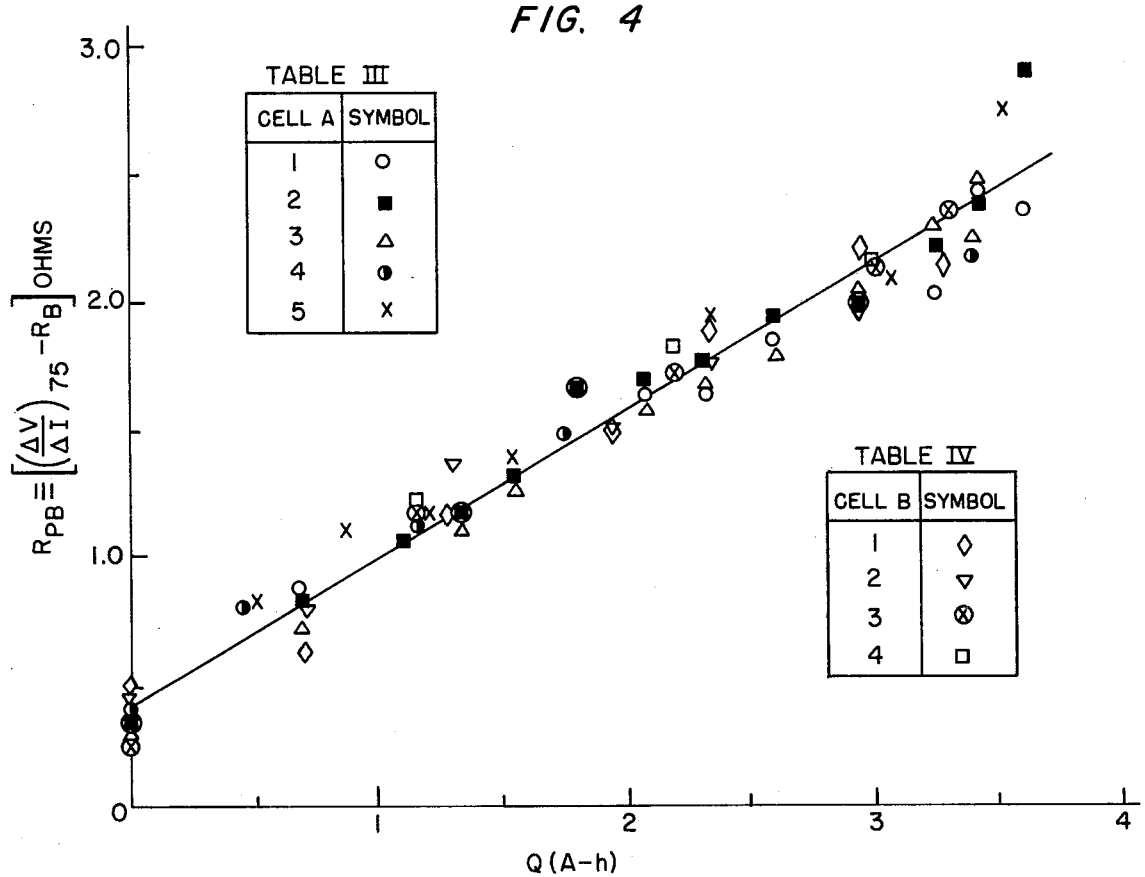
FIG. 4 represents a mean line curve produced by plotting polarization resistance $R_{PB}$ versus total prior discharge Q(A-h)

The internal AC resistance of the cell is measured either by a conventional high frequency AC bridge method well known in the art or by a system as shown in FIG. 1. The internal AC resistance of the cell as measured by the conventional high frequency AC bridge method is designated as $R_B$ and, therefore, yields an effective polarization resistance $R_{PB} = [(\Delta V/\Delta I)_{75mA} - R_B]$. A plot of $R_{PB}$ versus expended charge, Q(A–h) is shown in FIG. 4 for the same cells shown in FIG. 3. From FIG. 4, it can be determined that for 90% of the data points the experimental deviation from the mean curve is less than 6%.

Figure 5:
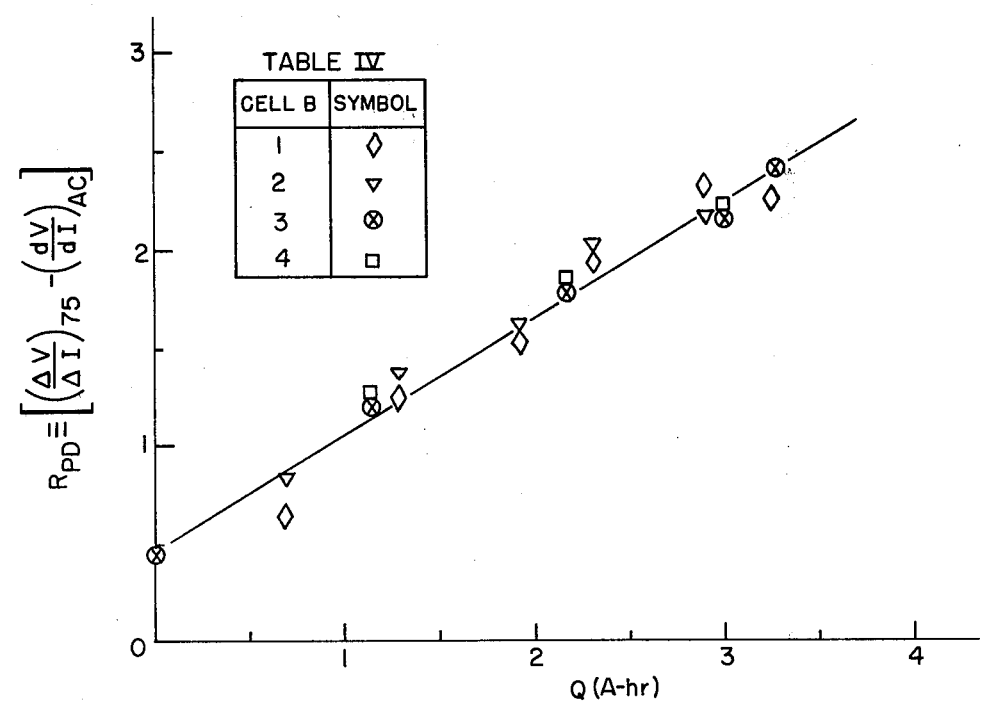
FIG. 5 represents a mean line curve produced by plotting polarization resistance $R_{PD}$ versus total prior discharge Q(A-h).

The internal AC resistance of the cells as measured by the system shown in FIG. 1 is designated as $(dV/dI)_{AC}$ and, therefore, yields an effective polarization resistance $R_{PD} = [(\Delta V/\Delta I)_{75mA} - (dV/dI)_{AC}]$. A plot of $R_{PD}$ versus expended charge, Q, is shown in FIG. 5 for cell type B of FIG. 4 and yields an accuracy somewhat better than that of FIG. 4. The increased accuracy obtained by the measurement system shown in FIG. 1 results from its ability to more effectively isolate the internal cell resistance from the polarization cell resistance due to the higher operating frequency.

Referring now to FIG. 1, at 50 there is shown a reference oscillator having an output frequency, f, of 3 to 6KHz. The output of oscillator 50 is R–C coupled to switch 44 to provide a small AC signal which is superimposed on the DC current for which $(dV/dI)_{AC}$ is desired. This resultant voltage is nulled and measured by differential lock-in amplifier 52 to produce a signal $(dV/dI)_{AC}$ which can be combined in X–Y recorder 42 to provide the values of $R_{PD}$ utilized for data points in FIG. 5. Calibration resistance 54 is used to calibrate the resistance scale when it is substituted for the cell by means of switch 44.

What is claimed is:
1. The method of determining the state-of-charge of zinc-mercuric oxide type primary cells comprising the steps of
    discharging new cells of said type at selected different rates to produce a plurality of discharged new cells of known state-of-charge value,
    graphically producing a mean linear curve by plotting the effective differential DC resistance value of each of said discharged new cells versus the said known state-of-charge value,
    determining the effective differential DC resistance of a used cell whose state-of-charge is to be determined,
    and locating on said mean linear curve the state-of-charge value corresponding to said used cell effective differential DC resistance, said corresponding value indicating the state-of-charge of said used cell.
2. The method in accordance with claim 1 wherein the method for determining the effective differential DC resistance comprises the steps of
    producing respective I–V curves for respective cells, and graphically determining the slope of the linear portion of said I–V curves, said slope $(\Delta V/\Delta I)$ being the effective differential DC resistance.
3. The method in accordance with claim 2 wherein said slope is measured at 75mA to provide effective differential DC resistance $(\Delta V/\Delta I)_{75mA}$.
4. The method of determining the state-of-charge of zinc-mercuric oxide type primary cells comprising the steps of
    discharging new cells of said type at selected different rates to produce a plurality of discharged new cells of known state-of-charge value,
    graphically producing a mean linear curve by plotting the effective polarization resistance value of each of said discharged new cells versus the said known state-of-charge value,
    determining the effective polarization resistance of a used cell whose state-of-charge is to be determined, and
    locating on said mean linear curve the state-of-charge value corresponding to said used cell effective polarization resistance, said corresponding value indicating the state-of-charge level of said used cell.
5. The method in accordance with claim 4 wherein the method of determining the effective polarization resistance comprises the steps of
    determining the effective differential DC resistance of said discharged cells,
    determining the internal high frequency AC resistance of said discharged cells, said effective polarization resistance being the difference between said effective differential DC resistance and said internal high frequency AC resistance of said discharged cells.
6. The method in accordance with claim 5 wherein the method for determining the effective differential DC resistance comprises the steps of
    producing I–V curves for respective cells, and graphically determining the slope of the linear portion of said I–V curves, said slope $(\Delta V/\Delta I)$ being the effective differential DC resistance.
7. The method in accordance with claim 6 wherein said slope is measured at 75mA to provide effective differential DC resistance $(\Delta V/\Delta I)_{75mA}$.

* * * * *